United States Patent
Chen

(10) Patent No.: US 8,520,385 B2
(45) Date of Patent: Aug. 27, 2013

(54) SERVER RACK

(75) Inventor: Chien-An Chen, Taipei (TW)

(73) Assignee: Inventec Corporation, Taipei (TW)

( * ) Notice: Subject to any disclaimer, the term of this patent is extended or adjusted under 35 U.S.C. 154(b) by 234 days.

(21) Appl. No.: 13/158,561

(22) Filed: Jun. 13, 2011

(65) Prior Publication Data

US 2012/0113592 A1 May 10, 2012

(30) Foreign Application Priority Data

Nov. 5, 2010 (TW) ................................ 99138217 A

(51) Int. Cl.
*H05K 7/20* (2006.01)

(52) U.S. Cl.
USPC ................ 361/695; 361/679.46; 361/679.48; 361/696; 361/699; 361/724; 165/80.3; 165/104.33; 165/80.4; 165/121; 165/185

(58) Field of Classification Search
USPC ................... 361/679.46–679.5, 679.53, 688, 361/689–695, 715–727; 165/80.2–80.5, 165/104.33, 121–126, 185; 174/50, 54, 59, 174/60, 70 R, 71, 71 R, 71 A, 72 R, 168, 174/173, 520; 312/223.2, 223.3, 223.6, 330.1, 312/334.1, 334.5, 334.7, 334.8; 454/184; 62/259.2
See application file for complete search history.

(56) References Cited

U.S. PATENT DOCUMENTS

| | | | |
|---|---|---|---|
| 6,305,180 B1 * | 10/2001 | Miller et al. | 62/259.2 |
| 6,611,428 B1 * | 8/2003 | Wong | 361/695 |
| 7,492,591 B1 * | 2/2009 | Aybay et al. | 361/695 |
| 7,804,690 B2 * | 9/2010 | Huang et al. | 361/724 |
| 8,004,839 B2 * | 8/2011 | Sato et al. | 361/696 |
| 8,139,358 B2 * | 3/2012 | Tambe | 361/695 |
| 2007/0081888 A1 | 4/2007 | Harrison | |
| 2007/0211439 A1 * | 9/2007 | Shimizu | 361/724 |
| 2008/0232064 A1 * | 9/2008 | Sato et al. | 361/687 |
| 2008/0239688 A1 * | 10/2008 | Casey et al. | 361/796 |
| 2009/0190301 A1 * | 7/2009 | Huang et al. | 361/679.46 |
| 2011/0116233 A1 * | 5/2011 | Beaudoin et al. | 361/695 |

* cited by examiner

*Primary Examiner* — Michail V Datskovskiy
(74) *Attorney, Agent, or Firm* — Morris Manning & Martin LLP; Tim Tingkang Xia, Esq.

(57) ABSTRACT

A server rack includes a cabinet, at least one fan, and at least one circuit board, in which the cabinet has a first side surface and a second side surface arranged along a first direction and opposite to each other. The fan is installed on the first side surface of the cabinet and blows an airflow in the first direction, the circuit board is installed in the cabinet along the second direction, and the second direction and the first direction are perpendicular to each other, so the airflow generated by the fan is blown to the circuit board, thereby performing heat dissipation.

8 Claims, 6 Drawing Sheets

SERVER RACK

CROSS-REFERENCE TO RELATED APPLICATIONS

This non-provisional application claims priority under 35 U.S.C. §119(a) on Patent Application No(s). 099138217 filed in Taiwan, R.O.C. on Nov. 5, 2010, the entire contents of which are hereby incorporated by reference.

BACKGROUND OF THE INVENTION

1. Field of Invention

The present invention relates to a server rack, and more particularly to a server rack with a main board of the server laterally installed.

2. Related Art

In recent years, Internet has been quickly and vigorously developed, especially for some large enterprises or business places of Internet, due to the requirements of the expansion of services, the quantity of servers becomes more and more, which results in the arrangement of the servers is more compact to save space. However, the large quantity of servers and other equipment arranged closely inevitably produce the excess heat, which further causes the unstable operation of the whole server system, and this is always the important issue for a data center.

In order to solve the heat dissipation problem of a large number of the servers placed in a closed room, the current conventional manner is arranging a cooling air-conditioning system in the room to perform heat dissipation, or when the number of server is small, the heat dissipation fan of the server is used to perform cooling. However, with the increasing of the number of servers, the rack is getting crowded, and the cool air blown by the conventional cooling air-conditioning system cannot flow to every corner of the room, and thus the hot air is concentrated in certain areas and the server system becomes unstable.

The fan module inside the conventional server rack is installed on the rear side of the rack, so the airflow generated by the fan module passes through the passage among the main boards of all servers respectively, and then is exhausted from the front side of the rack.

The problem of the aforementioned heat dissipation system lies in that the main board of the server is pushed into the rack from the opening on the front side of the rack, but when the airflow of the fan module is blown from the rear side of the rack to the front side, the airflow is easily blocked by the electronic devices, such as the hard drive, on the front end of the main board, and thus the airflow may be escaped and cannot effectively flow over the electronic components on the main board, and the heat generated by the main board of the server cannot be effectively dissipated.

Furthermore, in design, the main board of the server is mostly designed into a long rectangular shape, that is, the front and rear ends of the main board are relatively long, and the left and right ends are relatively short. However, when the airflow generated by the fan module is blown out from rear end to the front end, the airflow flows in a direction of the longest distance (that is, the front and rear ends) of the main board. If the airflow is blocked by the electronic devices on the front end of the main board, the air pressure of the airflow is insufficient to pass through the main board, and thus the hot airflow is easily concentrated on the main board, causing the heat accumulation phenomenon of the main board.

SUMMARY OF THE INVENTION

In view of the above problems, the present invention is a server rack, thereby solving the heat accumulation problem caused by the facts that the main board is difficult to be taken out from the server rack since the arrangement manner of the server rack is relatively limited due to the installation direction of the main board inside the server being the same as the direction of the airflow blown by the fan module and meanwhile the airflow generated by the fan module of the server has insufficient pressure to pass through the main board.

The server rack of the present invention comprises a cabinet, at least one fan, and at least one circuit board. The cabinet has a first side surface and a second side surface opposite to each other, and the first side surface and the second side surface are arranged along a first direction and form an accommodation room inside the cabinet. The fan is installed on the first side surface of the cabinet and blows an airflow in the first direction to the second side surface. The circuit board is installed in the cabinet along the second direction, and the second direction and the first direction are perpendicular to each other, such that the airflow generated by the fan is blown to the circuit board.

The present invention has the effects that the direction of the airflow blown by the fan and the installation direction of the circuit board are different axial directions, so the circuit board may be directly installed in the cabinet or removed from the cabinet without being limited to the arrangement manner of the server rack. Furthermore, the airflow generated by the fan passes through the circuit board along the shortest distance to perform the heat dissipation, thereby effectively preventing the hot airflow to backflow on the circuit board and further greatly improving the overall heat dissipation performance of the present invention.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1:
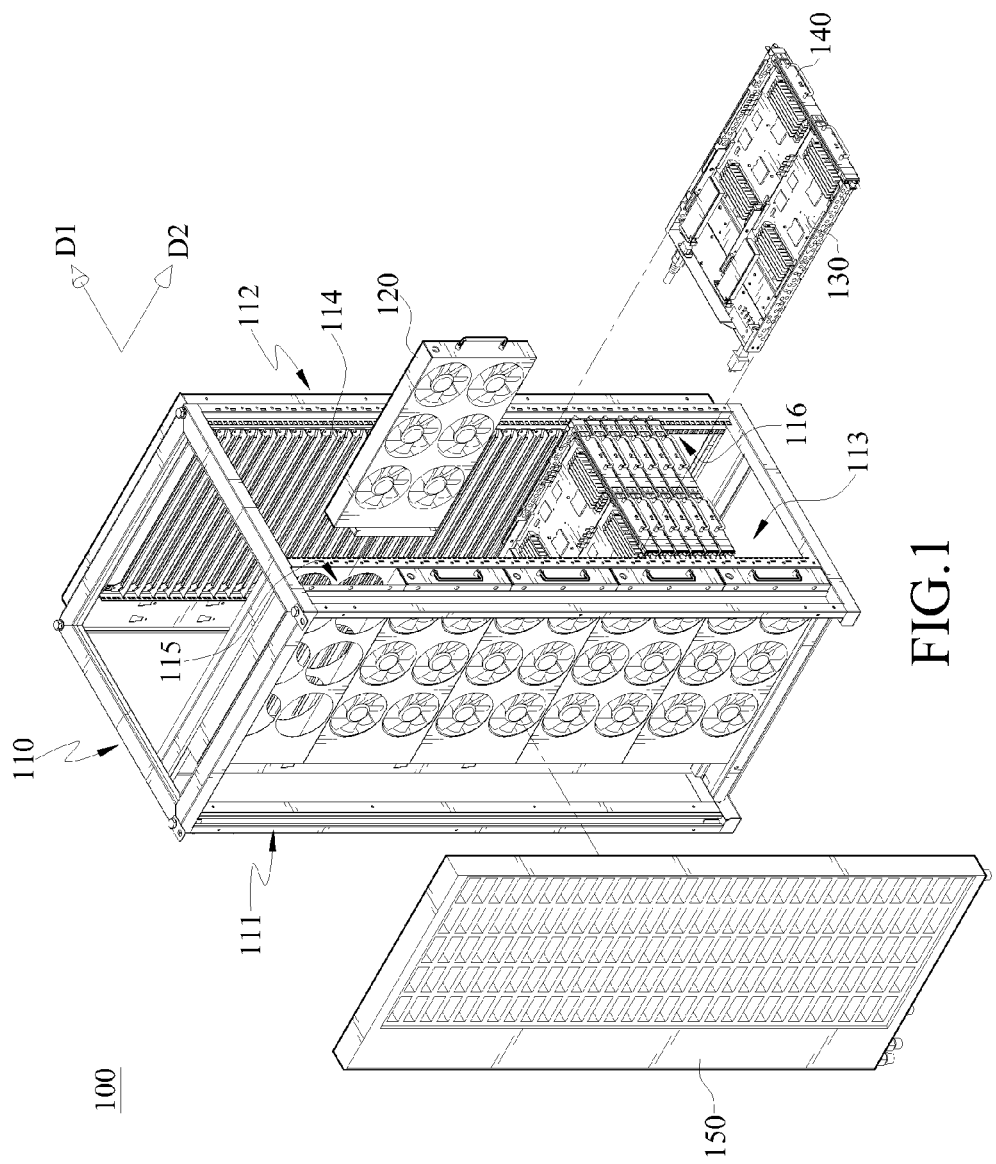
FIG. 1 is an exploded schematic view according to an embodiment of the present invention.
Figure 2A:
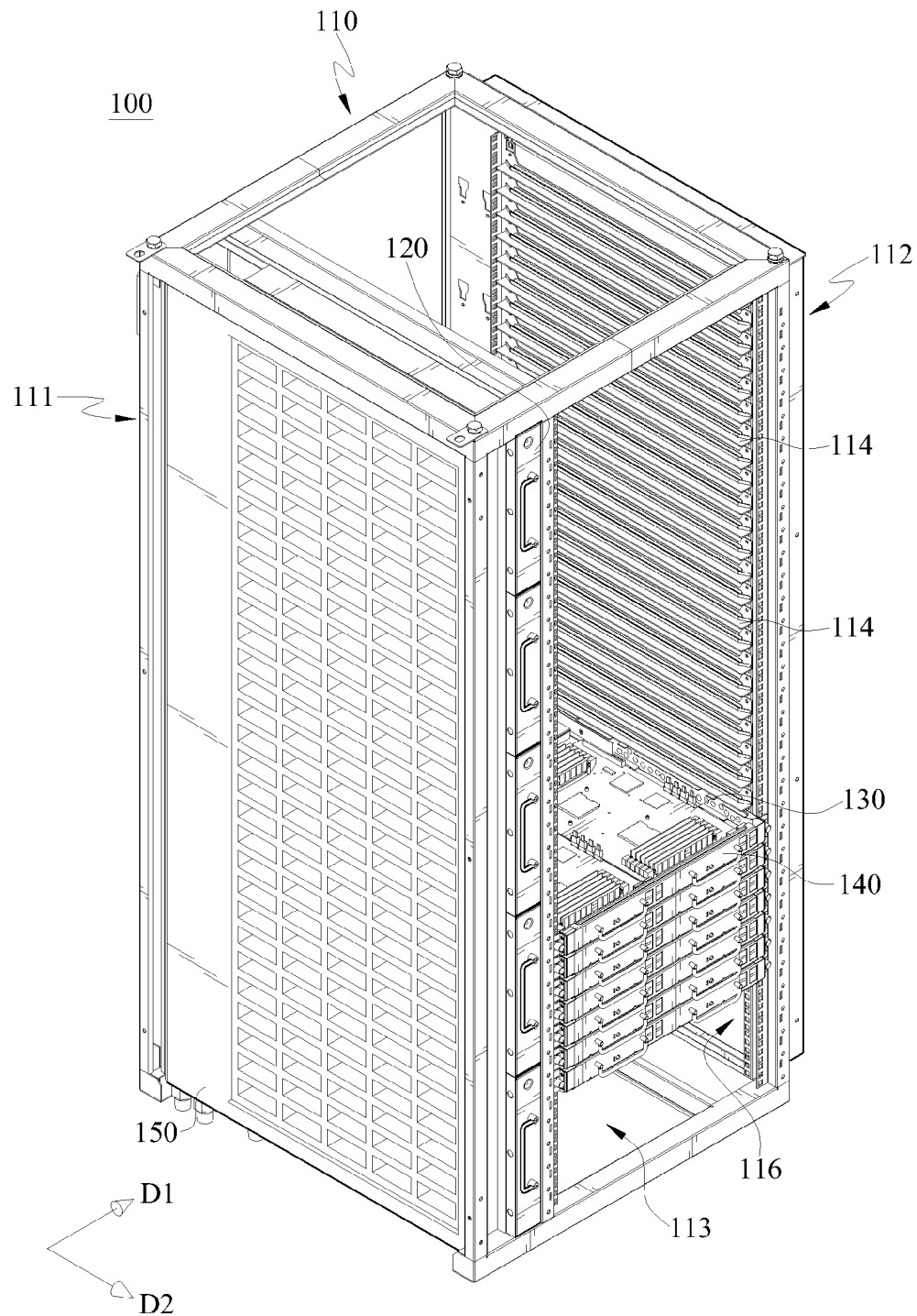
FIG. 2A is a schematic view according to the embodiment of the present invention.
Figure 2B:
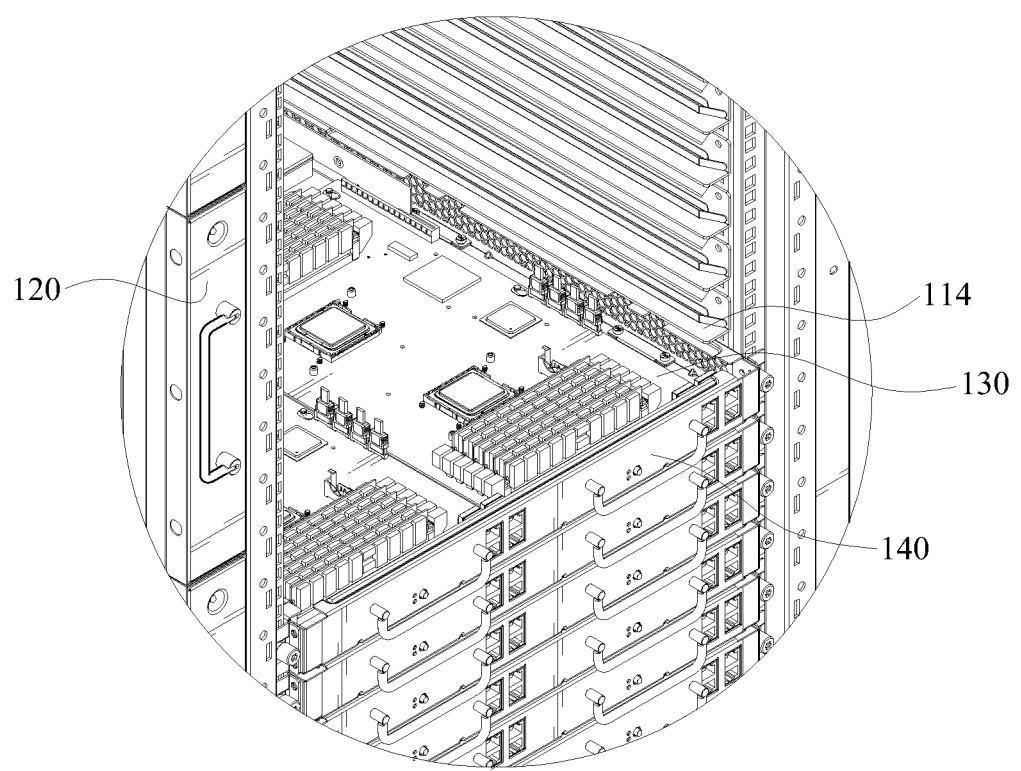
FIG. 2B is a partial enlarged schematic view according to the embodiment of the present invention.

FIGS. 1 to 2B are schematic views of an embodiment of the present invention, as shown in the figures, a server rack 100 of the present invention comprises a cabinet 110, at least one fan 120, and at least one circuit board 130. The cabinet 110 is a hollow rack constituted by multiple steel bars, steel plates, and angle steel, and the cabinet 110 has a first side surface 111 and a second side surface 112 opposite to each other and disposed at an interval to form an accommodation room inside the cabinet 110. Moreover, the first side surface 111 and the second side surface 112 are arranged along a first direction D1, and the cabinet 110 is opened with an opening 113 facing a second direction D2. The opening 113 is communicated with the accommodation room, such that the inside of the cabinet 110 is communicated with the outside through the opening 113. The second direction D2 and the first direction D1 are perpendicular to each other.

The first side surface 111 and the second side surface 112 of the cabinet 110 of the present invention respectively have corresponding at least one guide rail 114 protruding inwards there-from, and the direction of long axis of the guide rail 114 is parallel to the second direction D2, so the placement direction of the guide rail 114 and the first direction D1 are substantially perpendicular to each other. Furthermore, the first side surface 111 of the cabinet 110 further has at least one assembling frame 115, the assembling frame 115 is placed in the accommodation room of the cabinet 110, and the second side surface 112 of the cabinet 110 is further opened with a vent 116.

Referring to FIGS. 1 to 2B, the fan 120 is installed in the assembling frame 115 of the cabinet 110 along the second direction D2, so the fan 120 is held on the first side surface 111 of the cabinet 110 and remains the installation position unchanged. Moreover, an airflow is generated by the fan 120 in the first direction D1 and then is blown to the second side surface 112.

Figure 3A:
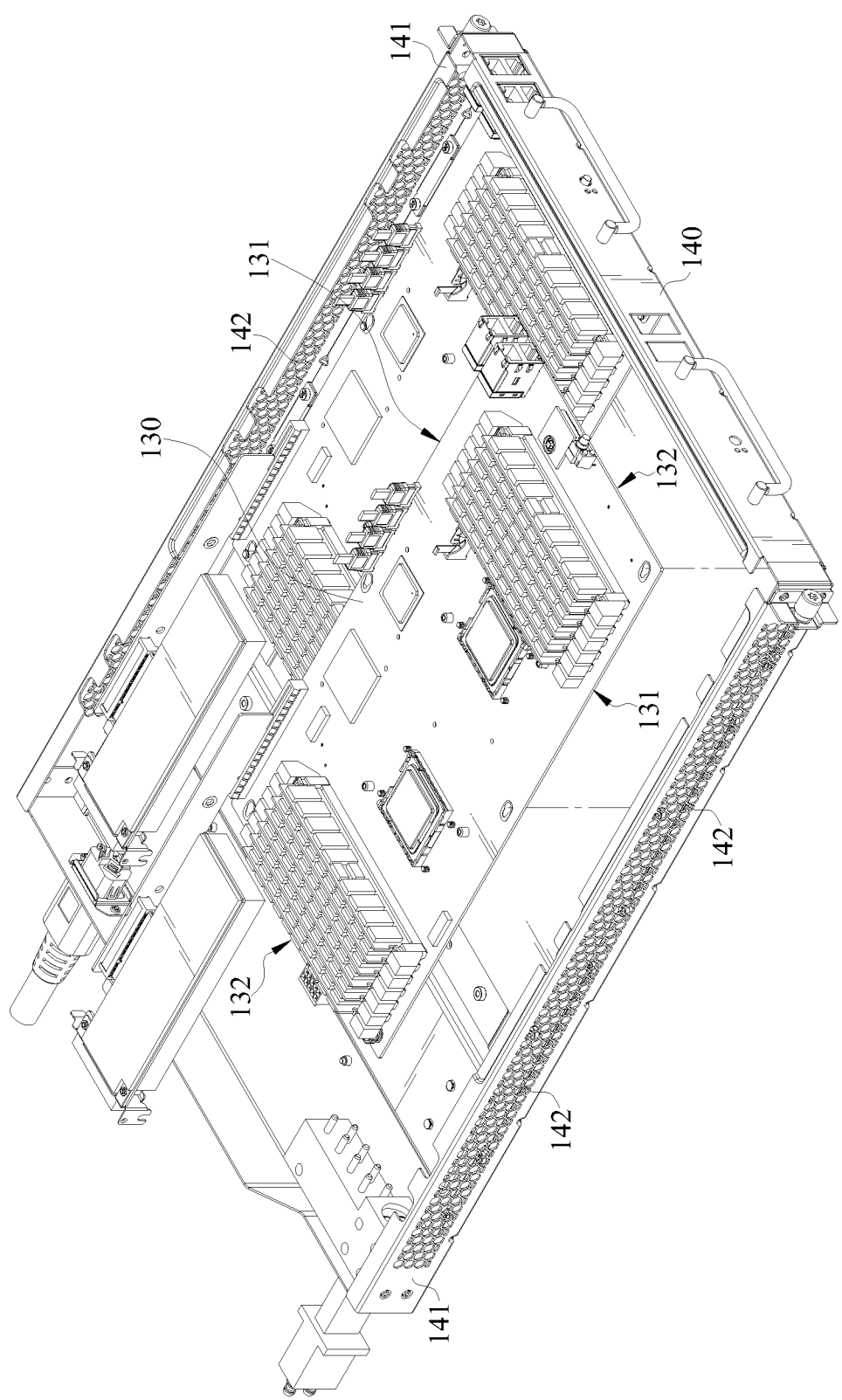
FIG. 3A is an exploded schematic view of a drawer and a circuit board according to the embodiment of the present invention.
Figure 3B:
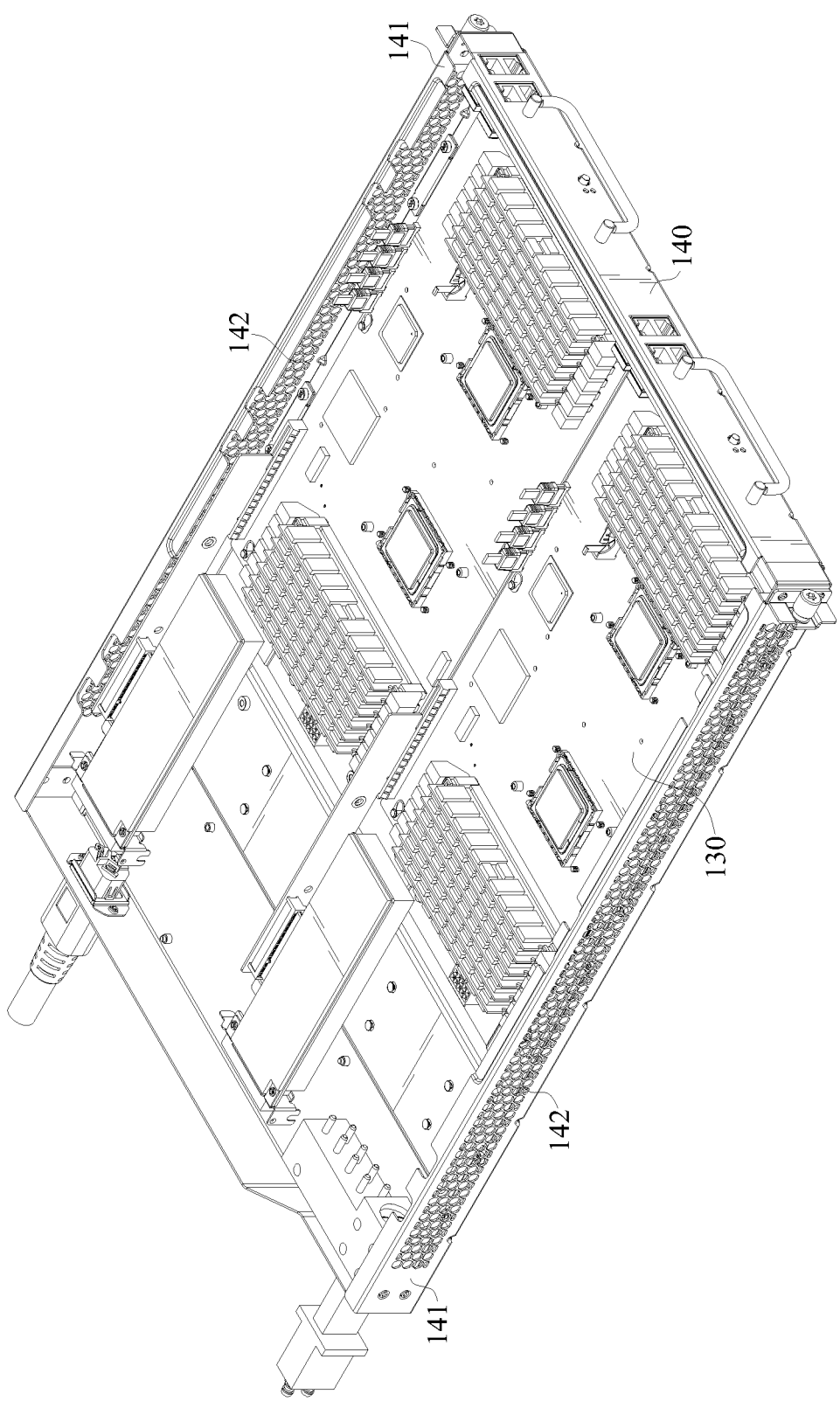
FIG. 3B is a schematic three-dimensional view of the drawer and the circuit board according to the embodiment of the present invention.

As shown in FIGS. 3A and 3B and referring to FIGS. 1 to 2B together, the server rack 100 of the present invention further comprises at least one drawer 140 made of a metal material, and the circuit board 130 is placed on the drawer 140. The circuit board 130 passes through the opening 113 from the lateral direction of the cabinet 110 along with the drawer 140 in the second direction D2 to be installed on the guide rail 114 and then slides in the accommodation room of the cabinet 110. The position of the circuit board 130 installed on the cabinet 110 is overlapped with the installation position of the fan 120, so the installation position of the circuit board 130 is corresponding to the first direction D1 (i.e., the direction of airflow blown by the fan 120).

In details, the drawer 140 has two side walls 141 opposite to each other, and is disposed in a direction perpendicular to the first direction D1. The side walls 141 are further opened with through holes 142. The circuit board 130 has two long side edges 131 opposite to each other and two short side edges 132 opposite to each other, so as to form a long rectangular plate structure. When the circuit board 130 is loaded on the drawer 140, the long side edges 131 of the circuit board 130 are parallel to the side walls 141 of the drawer 140. Therefore, after the circuit board 130 slides in the cabinet 110 along with the drawer 140, the short side edges 132 of the circuit board 130 are parallel to the first direction D1, and the long side edges 131 of the circuit board 130 are parallel to the second direction D2.

As shown in FIGS. 1 to 3B, the fan 120 is connected to an external power supply device and is actuated, and an airflow generated by the fan 120 in the first direction D1 is blown to the second side surface 112. Therefore, the airflow of the fan 120 firstly passes through the through holes 142 on the side walls 141 of the drawer 140 and then is blown to the circuit board 130, and performs convention heat dissipation with the circuit board 130. The airflow is blown along a direction (i.e., the first direction D1) parallel to the short side edges 132 of the circuit board 130, and the airflow transversely passes through the circuit board 130 and then is blown outside the cabinet 110 via the vent 116 of the second side surface 112 of the cabinet 110.

The circuit board 130 of the present invention may be directly loaded on the guide rail 114 of the cabinet 110 without being installed inside the cabinet 110 by the drawer 140. However, in order to prevent the circuit board 130 from directly contacting with the guide rail 114, the drawer 140 provides a good protection effect, thereby effectively avoiding the damage of the circuit board 130 caused by the collision with the guide rail 114 under an external force like vibration.

As shown in FIGS. 1 to 2B, the server rack 100 of the present invention further comprises at least one radiator 150, which is installed on the first side surface 111 of the cabinet 110 and outside the cabinet 110. The radiator 150 is connected to the external cooling water (not shown), such that the cooling water is introduced into the cabinet 110 to assist heat dissipation, for improving the overall heat dissipation performance. The radiator 150 and the fan 120 of the present invention are disposed adjacent to each other, and the radiator 150 is placed at an entrance end of the fan 120, thus effectively reducing the air temperature at the entrance end of the fan 120 to keep the airflow blown into the cabinet 110 at a low temperature.

It should be noted that the number of the fan 120 and the assembling frame 115 of the cabinet 110 of the present invention is multiple, and the number of the radiator 150 may also be multiple, so as to provide the optimal heat dissipation effect to the server rack 100. The number of the circuit board 130 and the guide rail 114 of the cabinet 110 may also be multiple, such that a single server rack 100 may have the optimal operation performance. The numbers of the components of the above server rack 100 are corresponding to each other, and those skilled in the art may adjust the number according to the practical requirements, which is not limited to the embodiments disclosed in the present invention.

Figure 4:
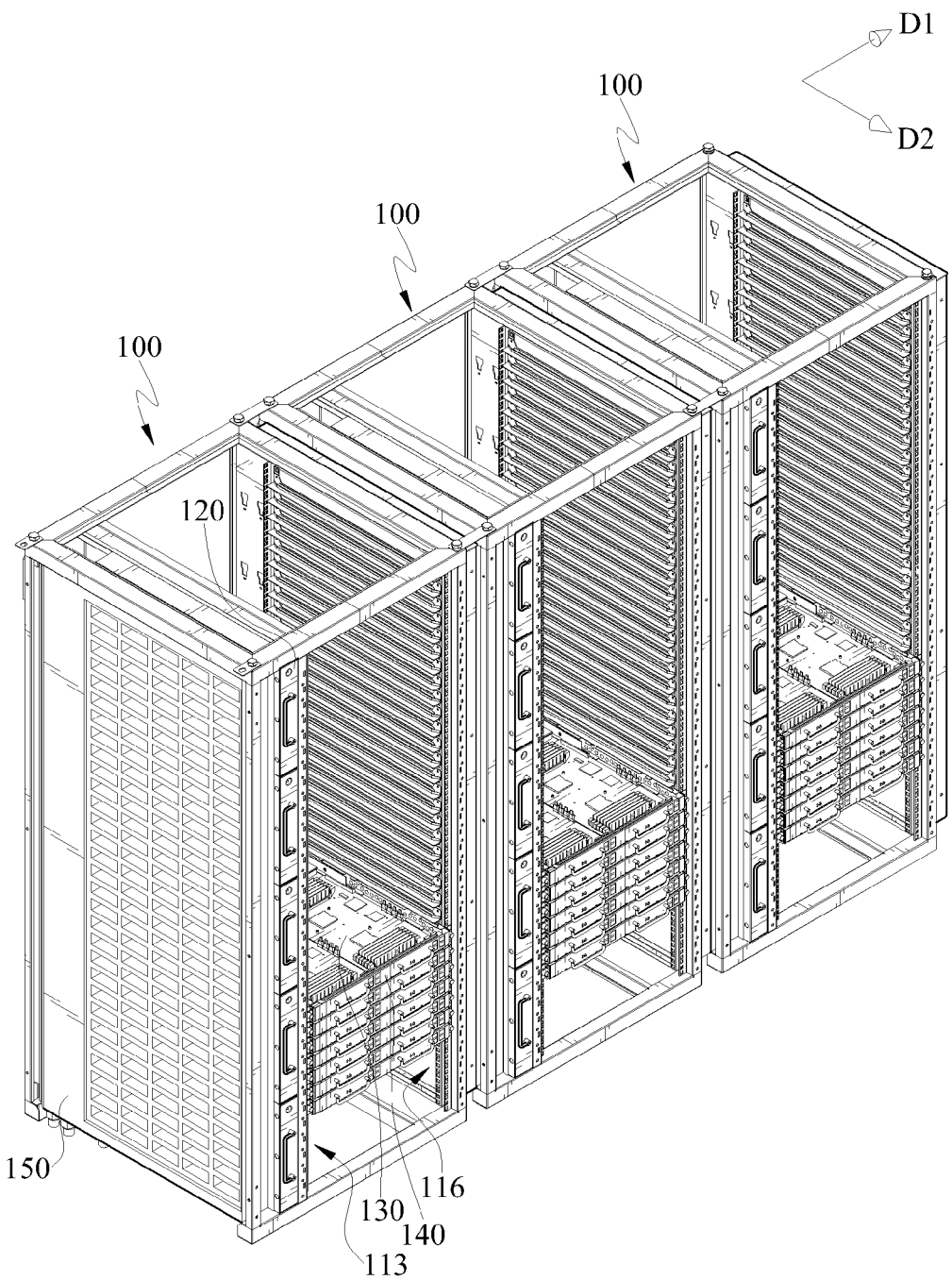
FIG. 4 is a schematic view of an arrangement of multiple server racks according to the embodiment of the present invention.

Referring to the schematic three-dimensional view of FIG. 4, when a plurality of server racks 100 of the present invention is assembled as a data center, the respective server rack 100 is arranged sequentially with the first side surface 111 facing the second side surface 112 of the adjacent server rack 100, and the airflow generated by the fan 120 is blown along the first direction D1 to form a circulating cooling flow field. The arrangement manner will not shield the opening 113 of the cabinet 110, so the circuit board 130 and the drawer 140 may be directly installed inside the cabinet 110 or removed from the cabinet 110 along the second direction D2 via the opening 113.

The direction of the airflow blown by the fan according to the server rack of the present invention is directed to the first direction, and the installation direction of the circuit board is directed to the second direction, and the two directions are belong to different axial directions, so the circuit board is not limited by the arrangement manner of the server rack due to the working direction of the fan, and the operator may directly install the circuit board inside the cabinet or remove the circuit board from the cabinet without moving the server rack, which is quick and convenient.

Furthermore, the airflow generated by the fan of the present invention passes through the short side edges of the circuit board, so the airflow passes through the circuit board to perform the convection heat dissipation with the shortest distance, and then is exhausted outside the cabinet via the vent, thus effectively avoiding the backflow of the hot airflow on the circuit board. Therefore, the overall heat dissipation performance of the present invention is greatly improved.

What is claimed is:

1. A server rack, comprising:
   a cabinet, having a first side surface and a second side surface opposite to each other, wherein the first side surface and the second side surface are arranged along a first direction and form an accommodation room inside the cabinet;

at least one fan, installed on the first side surface of the cabinet, wherein the at least one fan blows an airflow in the first direction to the second side surface;

at least one radiator, installed on the first side surface of the cabinet, wherein the at least one radiator and the at least one fan are disposed adjacent to each other, and the at least one radiator is placed at an entrance end of the at least one fan; and at least one circuit board, installed in the cabinet along a second direction, wherein the second direction and the first direction are perpendicular to each other, and the airflow of the at least one fan is blown to the at least one circuit board.

2. The server rack according to claim 1, wherein the cabinet further has an opening facing the second direction, and the opening is communicated with the accommodation room, the opening is used for the at least one circuit board to pass through the opening and to be installed in the cabinet.

3. The server rack according to claim 1, further comprising at least one drawer, wherein the at least one circuit board is placed on the at least one drawer and the at least one drawer is installed in the cabinet along the second direction.

4. The server rack according to claim 3, wherein the at least one drawer has two side walls opposite to each other, the two side walls are perpendicular to the first direction, and the two side walls respectively are opened with at least one through hole for the airflow to pass through.

5. The server rack according to claim 1, wherein the first side surface and the second side surface of the cabinet respectively have corresponding at least one guide rail, and the at least one circuit board is placed on the at least two guide rails and slides in the cabinet by the guide rails.

6. The server rack according to claim 1, wherein the cabinet further has at least one assembling frame disposed on the first side surface, and the at least one fan is installed inside the at least one assembling frame.

7. The server rack according to claim 1, wherein the second side surface of the cabinet is further opened with a vent, for the airflow generated by the at least one fan to be blown outside the cabinet.

8. The server rack according to claim 1, wherein the at least one circuit board has two long side edges opposite to each other and two short side edges opposite to each other, the two short side edges are parallel to the first direction, and the two long side edges are parallel to the second direction.

* * * * *